(12) United States Patent
Wieduwilt et al.

(10) Patent No.: US 11,217,296 B2
(45) Date of Patent: Jan. 4, 2022

(54) STAGGERED REFRESH COUNTERS FOR A MEMORY DEVICE

(71) Applicant: Micron Technology, Inc., Boise, ID (US)

(72) Inventors: Christopher G. Wieduwilt, Boise, ID (US); James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/833,045

(22) Filed: Mar. 27, 2020

(65) Prior Publication Data
US 2021/0304814 A1 Sep. 30, 2021

(51) Int. Cl.
*G11C 7/00* (2006.01)
*G11C 11/406* (2006.01)
*G11C 11/408* (2006.01)
*G06F 7/501* (2006.01)
*G11C 5/14* (2006.01)
*G11C 11/409* (2006.01)

(52) U.S. Cl.
CPC ........ *G11C 11/40615* (2013.01); *G06F 7/501* (2013.01); *G11C 5/144* (2013.01); *G11C 11/409* (2013.01); *G11C 11/4085* (2013.01)

(58) Field of Classification Search
CPC .............. G11C 11/40615; G11C 5/144; G11C 11/4085; G11C 11/409
See application file for complete search history.

(56) References Cited

U.S. PATENT DOCUMENTS

| 7,734,866 | B2 * | 6/2010 | Tsern | .................... G11C 11/406 711/106 |
| 8,543,777 | B2 * | 9/2013 | Koganezawa | .... G11C 11/40611 711/154 |
| 10,061,541 | B1 * | 8/2018 | Lee | .......................... G11C 7/10 |
| 10,878,877 | B2 * | 12/2020 | Cho | .................. G11C 11/40615 |

* cited by examiner

*Primary Examiner* — Pho M Luu
(74) *Attorney, Agent, or Firm* — Holland & Hart LLP

(57) ABSTRACT

Methods, systems, and devices for staggered refresh counters for a memory device are described. The memory device may include a set of memory dies each coupled with a common command and address (CA) bus and each including a respective refresh counter. In response to a refresh command received over the CA bus, each memory die may refresh a set of memory cells based on a value output by the respective refresh counter for the memory die. The refresh counters for at least two of the memory dies of the memory device may be offset such that they indicate different values when a refresh command is received over the CA bus, and thus at least two of the memory dies may refresh memory cells in different sections of their respective arrays. Offsets between refresh counters may be based on different fuse settings associated with the different memory dies.

20 Claims, 7 Drawing Sheets

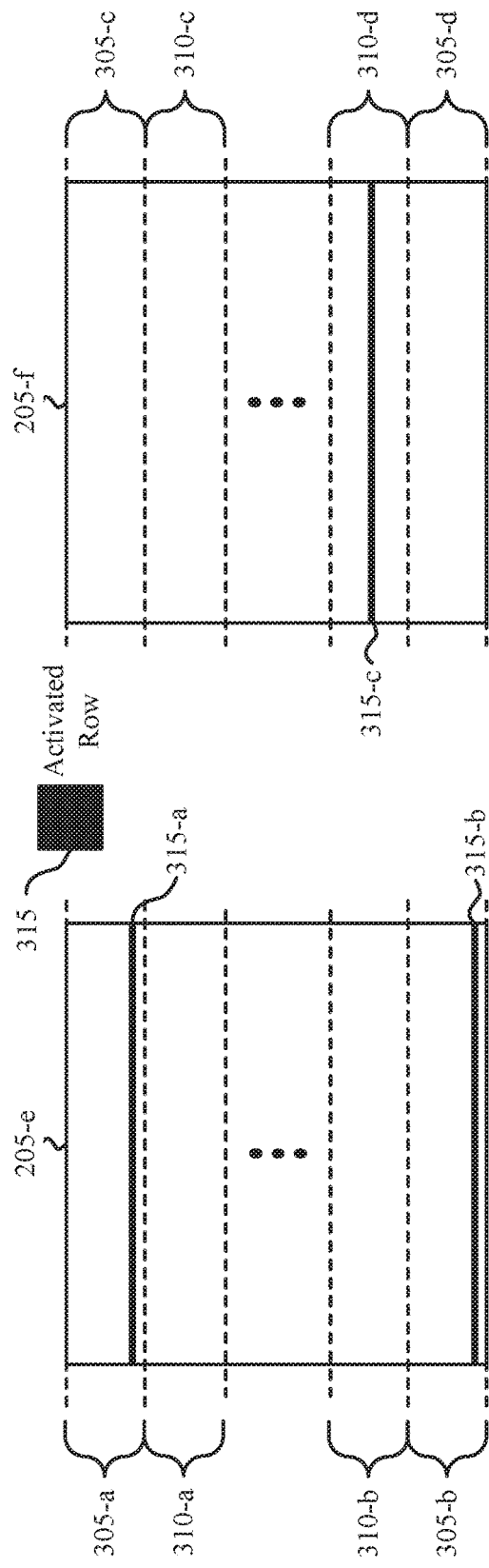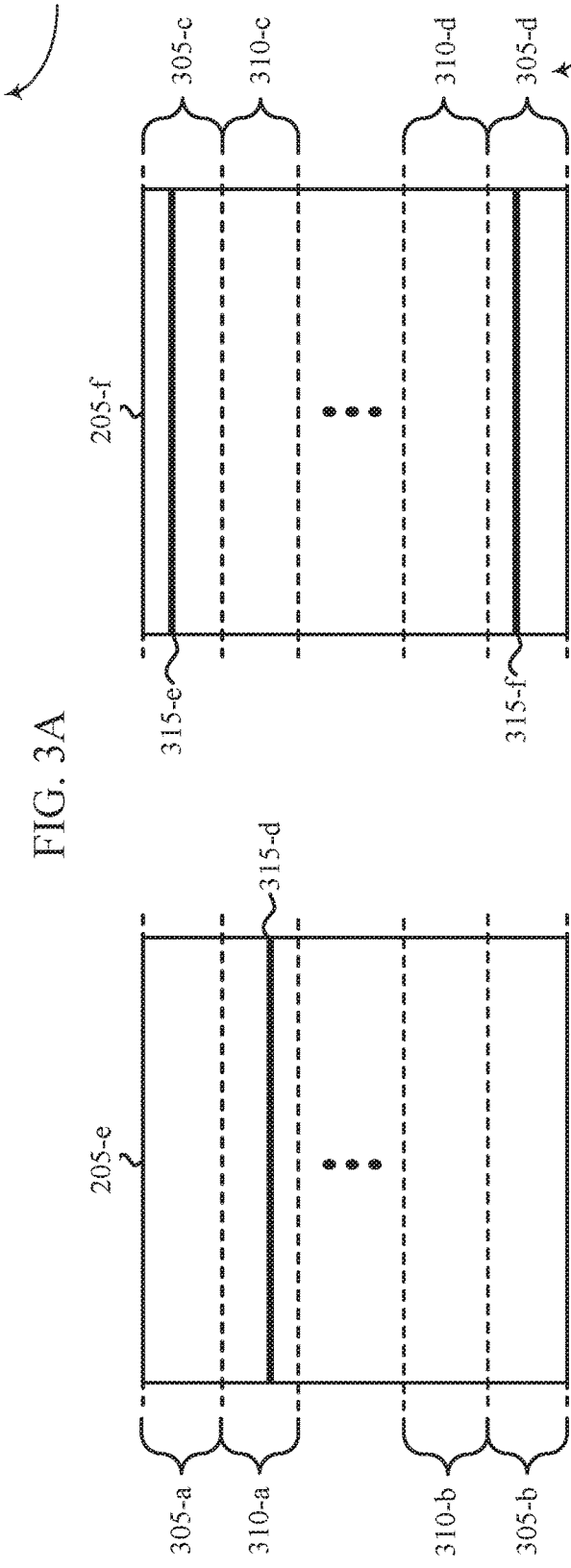
FIG. 3A
FIG. 3B

STAGGERED REFRESH COUNTERS FOR A MEMORY DEVICE

BACKGROUND

The following relates generally to one or more memo systems and more specifically to staggered refresh counters for a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic value for extended periods of time even in the absence of an external power source. Volatile memory devices, e.g., DRAM, may lose their stored state when disconnected from an external power source.

BRIEF DESCRIPTION OF THE DRAWINGS

FIGS. 3A and 3B illustrate examples of refresh procedures that support staggered refresh counters for a memory device in accordance with examples as disclosed herein.

DETAILED DESCRIPTION

Figure 1:
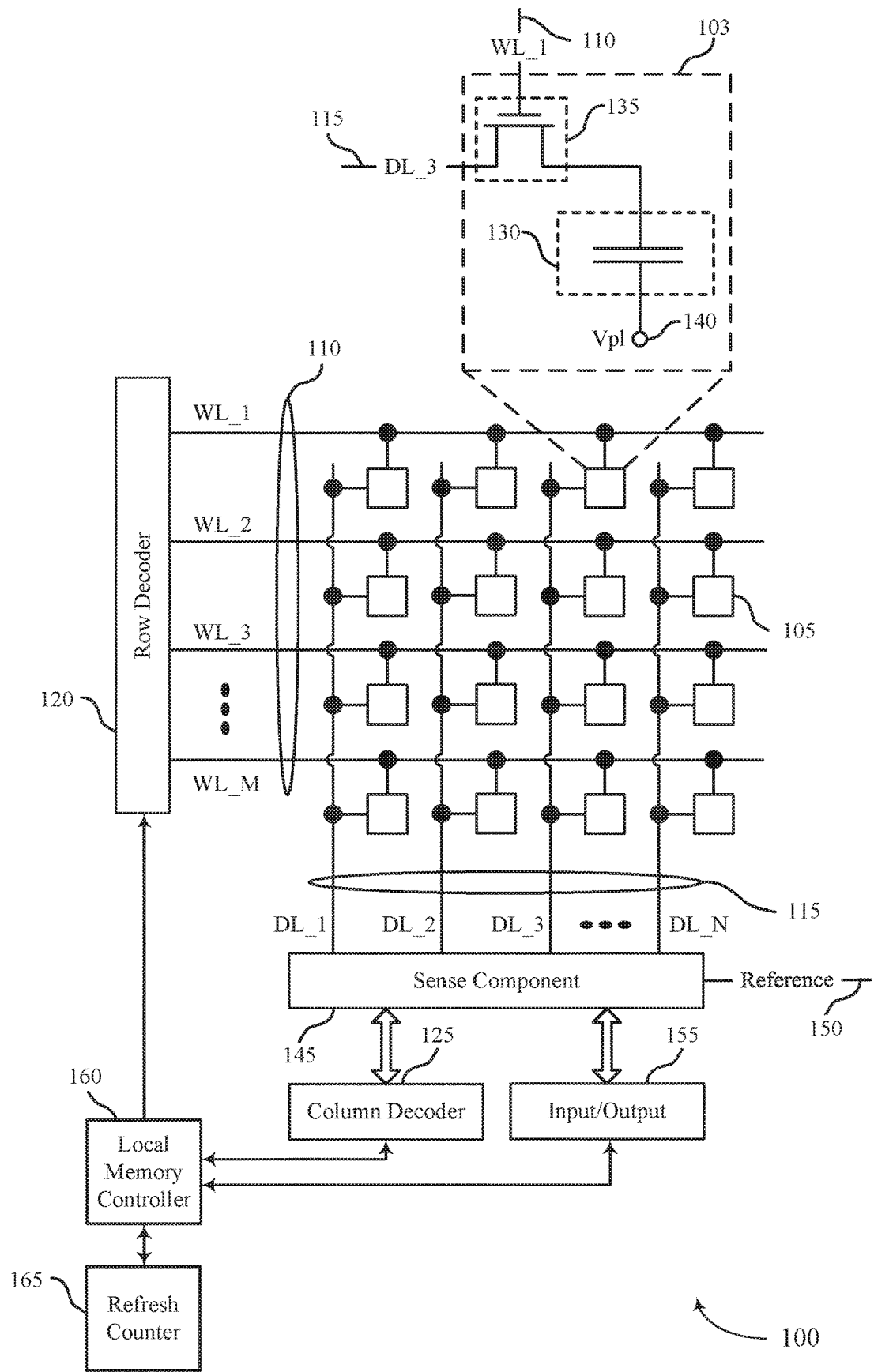
FIG. 1 illustrates an example of a memory die that supports staggered refresh counters for a memory device in accordance with examples as disclosed herein.

For some types of memory cells (e.g., volatile memory cells), refresh operations may be used to maintain the logic values stored by the memory cells. For example, the memory cells may lose their stored logic values over time (e.g., due to leakage or other effects), and a refresh operation may include reading stored logic values from a set of memory cells and writing those same logic values back to the set of memory cells.

In some cases, a memory array may include multiple memory sections. Within a section, memory cells may be organized as multiple rows and multiple columns, with each row of memory cells coupled or otherwise associated with a corresponding row line, and each column of memory cells coupled or otherwise associated with a corresponding column line. Row lines may alternatively be referred to as word lines, and column lines may alternatively be referred to as digit lines or bit lines, among other possible terms. Some memory arrays may include multiple types of memory sections, and performing a refresh operation for memory cells in one type of memory section may include activating more word lines than performing a refresh operation in another type of memory section.

As one example, in some array architectures, sense components (e.g., sense amplifiers) may be located between memory sections of an array, and when memory cells in an inner section of the array are accessed (e.g., read, written, or refreshed), two sets of sense components may be used, with some of the digit lines in the memory section coupled with a first set of sense components on one side of the memory section and other digit lines in the memory section coupled with a second set of sense components on another side of the memory section. When memory cells in an edge section of the array are accessed, however, only one set of sense components may be available there may be sense components on only one side of the section due to the section being on the edge of the array, for example. Thus, although a row of memory cells in an edge section may include the same quantity of memory cells as a row of memory cells in an inner section (e.g., to reduce fabrication complexity, or for any number of other reasons), activating one word line in the edge section may nevertheless support accessing a lesser quantity of memory cells (e.g., only memory cells coupled with odd-numbered digit lines, or memory cells coupled with even-numbered digit lines) compared to activating one word line in the inner section.

Accordingly, in some cases, in order to refresh or activate a same quantity of refreshed memory cells in all refresh operations, more word lines may be activated (e.g., twice as many) when memory cells are refreshed within edge sections than when memory cells are refreshed within an inner section. For example, for a refresh operation in an edge section, multiple word lines may be activated across different sections (e.g., one word line may be activated in one edge section, and another word line may be activated in another section, such as another edge section on the opposite side of the array or an inner section configured to be accessed concurrently with one or more edge sections). Because more word lines may be activated in total per refresh operation, refresh operations for edge sections may draw more power and/or current as compared to refresh operations for inner sections.

It is to be understood that the foregoing is just one example, and a refresh operation for one type of memory section may involve the activation of one or more additional word lines relative to a refresh operation for another type of memory section for any number of other reasons. Further, it is to be understood that while the term inner section may be used herein to refer to a first type of memory section for which a baseline (e.g., default) quantity of one or more word lines is activated for each refresh operation, and the term edge section may be used herein to refer to a second type of memory section for which at least one additional word line is activated for each refresh operation, the use of such terms is for clarity and brevity of discussion only; the first type of memory section need not necessarily be physically located in the interior of a memory array, and the second type of memory section need not necessarily be physically located at the edge (periphery) of a memory array, depending on array architecture or other factors.

In some cases, multiple memory dies in a same device (e.g., dies in a same rank, such as a rank in a dual in-line memory module (DIMM)) may each include at least one respective memory array and may share a same command/address (CA) bus. Because the CA bus is shared, refresh commands over the CA bus may also be shared (e.g., each of the memory dies may receive a same refresh command at the same time). If the multiple memory dies each refresh memory cells within edge sections at the same time, a power and/or current spike may occur for the device. This may cause the peak power and/or current for the device to rise accordingly, along with the peak-to-average-power ratio (PAPR) for the device. Such current/power spikes may be undesirable for any number of reasons, as may be appreciated by one of ordinary skill in the art.

As described herein, a memory die may include or otherwise be associated with (e.g., be coupled with) a refresh counter, and when the memory die is to perform a refresh operation, the memory die may activate one or more word lines based on a value (e.g., binary number) indicated by the refresh counter. For example, the value of the refresh counter may comprise or otherwise indicate a row address, and when the memory die performs a refresh operation, it may refresh a set of one or more rows of memory cells, where the set includes the row corresponding to the operative value of the refresh counter.

To prevent a set of memory dies from all refreshing edge sections at the same time, even if they share the same CA bus or otherwise perform concurrent refresh operations, the refresh counters for at least some of the memory dies may be staggered (offset relative to each other) such that at any given time, at least some of the memory dies have refresh counters with different values. The different counters may be offset, for example, by an amount at least as large as a number of rows in each section. Thus, when a refresh command is received, even if one or more memory dies of the device have refresh counters with values pointing to rows in edge sections, one or more other memory dies of the device may have refresh counters with different values that point to rows in inner sections.

To introduce the staggering between refresh counters, fuse circuitry be provided (e.g., within the device) for each memory die and configured such that the refresh counters for at least some of the memory dies are set to indicate different (e.g., offset, staggered) values. For example, such staggering may be introduced upon a boot or reboot of the dies (e.g., of a device that include the dies). In some cases, the refresh counters at the memory dies may be incremented in like fashion (e.g., according to the same pattern or progression) as refresh commands are received and refresh operations are performed at the different dies thus, offsets between refresh counters may be maintained during operation of the memory dies.

Features of the disclosure are initially described in the context of a memory die as described with reference to FIG. 1. Features of the disclosure are then described in the context of a devices, systems, refresh procedures, and bit inversion schemes as described with reference to FIGS. 2-4. These and other features of the disclosure are further illustrated by and described with reference to an apparatus diagram and flowcharts that relate to staggered refresh counters for a memory device as described with references to FIGS. 5-7.

FIG. 1 illustrates an example of a memory die 100 that supports staggered refresh counters for a memory device in accordance with examples as disclosed herein. In some examples, the memory die 100 may be referred to as a memory chip and may be included in a memory device or an electronic memory apparatus (e.g., one or more memory dies 100 may be included in a package, and the package may be mounted on or otherwise included in a DIMM or other type of module). The memory die 100 may include one or more memory cells 105 each be programmable to store one of a set logic values (e.g., programmed to one of a set of two or more possible states). For example, a memory cell 105 may be operable to store one hit of information at a time (e.g., a logic 0 or a logic 1).

In some cases, a memory cell 105 may store a charge representative of the programmable states (corresponding to respective logic values) in a capacitor. For example, DRAM architectures may include a capacitor that includes a dielectric material to store a charge representative of the programmable state. In other memory architectures, other storage devices and components are possible. For example, nonlinear dielectric materials may be employed. The memory cell 105 may include a logic storage component, such as capacitor 130, and a switching component 135. A node of the capacitor 130 may be coupled with a voltage source 140, which may be the cell plate reference voltage, such as Vpl, or may be ground, such as Vss.

The memory die 100 may include one or more access lines (e.g., one or more word lines 110 and one or more digit lines 115) arranged in a pattern, such as a grid-like pattern of rows and columns as shown in the example of FIG. 1, An access line may be a conductive line coupled with a memory cell 105 and may be used to perform access operations on the memory cell 105. In some examples, word lines 110 may be referred to as row lines, and a set of memory cells coupled with a same word line 110 may be referred to as a row. In some examples, digit lines 115 may be referred to as column lines or bit lines, and a set of memory cells coupled with a same digit line 115 may be referred to as a column. References to access lines, row lines, column lines, word lines, digit lines, or bit lines, or their: analogues, are interchangeable without loss of understanding or operation. In some cases, memory cells 105 may be positioned at intersections of the word lines 110 and the digit lines 115.

Operations such as reading and writing may be performed on the memory cells 105 by activating or selecting access lines such as one or more of a word line 110 or a digit line 115. Activating a word line 110 or a digit line 115 may include biasing the word line 110 or the digit line 115 to a specific voltage (e.g., applying a voltage to the word line 110 or the digit line 115). In some architectures, while a word line 110 for a memory cell 105 is activated, the memory cell 105 may be accessed (e.g., written or read) based on setting or sensing a voltage of the corresponding digit line 115. The intersection of a word line 110 and a digit line 115 in either a two-dimensional or three-dimensional configuration may be referred to as an address of a memory cell 105. Further, a word line 110 may be assigned a corresponding word line address (alternatively, row address), and a digit line 115 may be assigned a corresponding digit line address (alternatively, column address).

Activating the word lines 110 and digit lines 115 may be controlled through a row decoder 120 or a column decoder 125. For example, a row decoder 120 may receive a row address from the local memory controller 160 and activate a word line 110 based on the received row address. In some cases, for a refresh operation, the row address may be provided to the row decoder 120 or to the local memory controller 160 (e.g., for relay to the row decoder 120) from a refresh counter 165, as described in greater detail elsewhere herein. A column decoder 125 may receive a column address from the local memory controller 160 and may activate one or more digit lines 115 based on the received column address.

Selecting or deselecting the memory cell 105 may be accomplished by activating or deactivating the switching component 135 based on activating or deactivating a word line 110 that is coupled with the switching component 135. For example, the capacitor 130 may be isolated from digit line 115 when the switching component 135 is deactivated (based on the word line 110 being deactivated), and the capacitor 130 may be coupled with digit line 115 when the switching component 135 is activated (based on the word line 110 being activated).

The sense component 145 may be operable to detect, via a corresponding digit line 115, a state (e.g., a charge) stored on the capacitor 130 of the memory cell 105 and determine a logic value of the memory cell 105 based on the stored state. The sense component 145 may include one or more sense amplifiers to amplify or otherwise convert a signal on the digit line 115 that results from accessing the memory cell 105. The sense component 145 may compare a signal detected from the memory cell 105 to a reference 150 (e.g., a reference voltage). In some cases (e.g., for a read operation), the detected logic value of the memory cell 105 may be provided as an output of the sense component 145 (e.g., to an input/output 155), which may indicate the detected logic value to another component of a memory device that includes the memory die 100. For a refresh operation, the detected logic value may be written back to the memory cell 105 (e.g., by or otherwise using the sense component 145).

The local memory controller 160 may control the accessing of memory cells 105 through the various components (e.g., row decoder 120, column decoder 125, sense component 145). In some examples, one or more of the row decoder 120, column decoder 125, and sense component 145 may be co-located with (e.g., included in) the local memory controller 160. The local memory controller 160 may be operable to receive one or more of commands or data from a host device or another controller associated with the memory die 100, translate the commands or the data (or both) into information that can be used by the memory die 100, perform one or more operations on the memory die 100, and communicate data from the memory die 100 to a host device based on performing the one or more operations.

For example, the local memory controller 160 may be operable to perform one or more access operations on one or more memory cells 105 of the memory die 100. Examples of access operations may include write operations, read operations, or refresh operations, among others. In some examples, access operations may be performed by or otherwise coordinated by the local memory controller 160 in response to various access commands, which may be generated internally or received from an external device (e.g., from a host device). The local memory controller 160 may in some cases be operable to perform other access operations not listed here or other operations related to the operating of the memory die 100 that are not directly related to accessing the memory cells 105.

For some types of memory cells 105, such as volatile memory cells 105, a logic value stored by a memory cell 105 may degrade over time (e.g., due to leakage or other effects). The local memory controller 160 may perform re-write or refresh operations (e.g., periodically or on another scheduled or commanded basis) to maintain the memory cells 105 as storing their respective logic values. Performing a refresh operation may involve activating one or more word lines 110, where the local memory controller 160 may rewrite a stored logic value to memory cells 105 coupled with the one or more word lines 110.

As shown in the example of FIG. 1, the memory die 100 may include a refresh counter 165. The refresh counter 165 may be coupled with local memory controller 160. Alternatively, the refresh counter 165 may be included in local memory controller 160 or directly coupled with the row decoder 120, among other possible configurations. The refresh counter 165 may indicate a value corresponding to (e.g., comprising or otherwise indicating) a word line address (alternatively, a row address, word line index, or refresh index), where each word line 110 has a unique word line address.

When a refresh operation is to be performed, the word line 110 having the word line address corresponding to the value of the refresh counter 165 may be activated, and some or all of the memory cells 105 coupled with the activated word line 110 may be refreshed. In some cases, the memory die 100 may refresh multiple rows (e.g., two, four, eight, or sixteen rows) of memory cells 105 as part of a single refresh operation, which may be coupled with a corresponding set of word lines 110 referred to as a word line group. The value of the refresh counter 165 may indicate a starting word line address for the word line group, or each word line group may have a corresponding refresh index, for example. The refresh counter 165 may increment (or alternatively decrement) its value for each refresh operation, such that when the next refresh operation is to be performed, the value of the refresh counter 165 corresponds to a word line 110 (or word line group) coupled with cells that were not refreshed as part of the prior refresh operation. In some cases, a refresh operation may be performed in response to a command received by the memory die 100 from an external device (e.g., a host device). Additionally or alternatively, a refresh operation may be performed based on a command generated internally at the memory die 100 (e.g., by the local memory controller 160).

And in some cases, the memory die 100 may perform multiple refresh operations (e.g., each for a distinct word line group) based on a single refresh command received from an external device. For example, the memory die 100 may be configured to generate some quantity of additional internal refresh commands subsequent to receiving each external refresh command, the memory die 100 may refresh a row or group of rows in response to each refresh command, irrespective of whether the refresh command is received from an external source or is internally generated.

Figure 2:
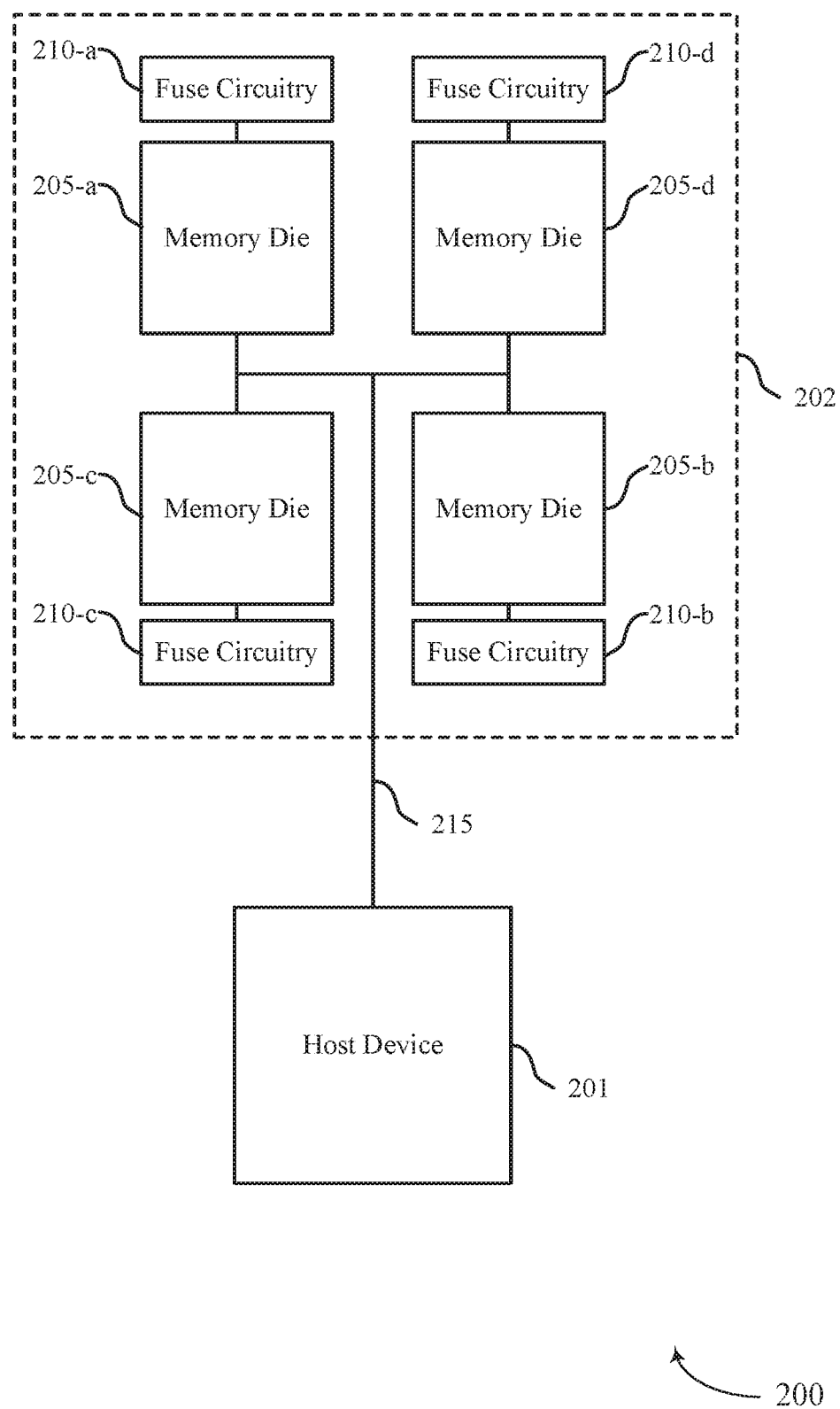
FIG. 2 illustrates an example of a system that supports staggered refresh counters for a memory device in accordance with examples as disclosed herein.

FIG. 2 illustrates an example of a system 200 that supports staggered refresh counters for a memory device in accordance with examples as disclosed herein.

System 200 may include a host device 201. The host device 201 may be an example of a device that uses memory to execute processes, such as a central processing unit (CPU), a graphics processing unit (GPU), or another type of processor.

System 200 may also include a memory device 202. Memory device 202 may include two or more memory dies 205. Though four memory dies 205 are shown, it is to be understood that any number of memory dies 205 are possible. Memory dies 205-a, 205-b, 205-c, and 205-d may each be an example of a memory die 100 as described with reference to FIG. 1. For example, each memory die 205 may include a refresh counter. In some cases, memory device may be a module (e.g., a DIMM).

Each memory die 205 within memory device 202 may be coupled with host device 201 via shared CA bus 215. In some cases, the memory dies 205 that share CA bus 215 may be collectively referred to a rank, and though one rank is shown, memory device 202 may include any number of ranks. The CA bus 215 may carry signals between the host device 201 and the memory dies 205, and the CA bus 215 may comprise any combination of one or more coupled signal paths (e.g., wire traces, bond wires, pads or pins, or the like). As the CA bus 215 may be shared among the memory dies 205, each signal transmitted by the host device 201 may be received by each of the memory dies 205. Some examples of signals transmitted by the host device along the CA bus 215 may include commands such as read commands, write commands, and refresh commands. The host device 201 may also be coupled with one or more data (DQ) buses (not shown), which may carry data between the host device 201 and the memory dies 205, where the data may be associated with (e.g., read or written in response to) the commands over the CA bus 215.

Each memory die 205 may be coupled with a respective fuse circuitry 210. For instance, memory die 205-a may be coupled with fuse circuitry 210a, memory die 205-b may be coupled with fuse circuitry 210-b, memory die 205-c may be coupled with fuse circuitry 210-c, and memory die 205-d may be coupled with fuse circuitry 210-d. Each fuse circuitry 210 may include any number of fuses (or alternatively, anti-fuses or some other kind of non-volatile storage element), and the states of the fuses within a fuse circuitry 210 may control (e.g., initialize or otherwise set) one or more operating parameters or other settings for the corresponding memory die 205.

A memory die 205 may read (sense or otherwise detect) the state of the fuses in the corresponding fuse circuitry 210 upon a boot event (booting or rebooting). For example, a memory die 205 may initialize or otherwise set its refresh counter to an initial value based on (as indicated by) the state of one or more fuses in the corresponding fuse circuitry 210. The states of the fuses in different fuse circuitries 210 may be varied such that the refresh counters for at least some of the memory dies 205 are set to different initial values that is, are offset.

After the boot event, the host device 201 may send commands to the memory dies 205 (e.g., write, read, refresh commands) via CA bus 215. The host device 201 and the memory dies 205 also may exchange data based on the commands via one or more other buses. When the host device 201, transmits a refresh command via CA bus 215, each of the memory dies 205 may receive the refresh command, and each of the memory dies 205 may refresh a respective set of memory cells based on the refresh command. For each memory die 205, which memory cells are refreshed may depend on the value of the refresh counter for the memory die 205 at the time the refresh command is received. Thus, if two memory dies 205 have refresh counters that indicate different values at the time the refresh command is received, the two memory dies 205 may refresh memory cells in different rows in response to the same refresh command, based on the different values of the two respective refresh counters. The refresh counters of the memory dies 205 may increment (or decrement) in like fashion (e.g., by a same amount, or otherwise according to same pattern) in response to each refresh command over the bus 215. Thus, any offsets between refresh counters for the memory dies 205 introduced upon boot up (e.g., by the fuse circuitries 210) may persist (be maintained) as the memory device 202 operates.

FIGS. 3A and 3B illustrate examples 300-a and 300-a of refresh operations in accordance with examples as disclosed herein. The refresh operations shown in FIGS. 3A and 3B may be performed by memory dies 205-e and 205-f, which may share a common CA bus 215 and be examples of memory dies 205 within a memory device 202 as described with reference to FIG. 2. Example 300-a may illustrate respective refresh operations by the two memory dies 205-c, 205-f at a first time, and example 300-a may illustrate respective refresh operations by the two memory dies 205-e, 205-f at a second time.

Both memory dies 205-e, 205-f may have two edge sections 305 and some number of inner sections 310. A refresh operation performed for edge sections 305 may involve the activation of more rows (more word lines) than a refresh operation performed in an inner section 310. For example, a refresh operation performed for the edge sections 305 may involve the activation of twice as many rows 315 (e.g., more word lines) as a refresh operation performed in an inner section 310. For instance, a first row 315 of a first edge section 305 and a second row 315 of a second edge section 305 may be activated as part of a single refresh operation for the edge sections 305, whereas a single row 315 may be activated as part of a single refresh operation for an inner section 310. As one example, a first of the two edge sections 305 may have memory cells coupled with odd-indexed digit lines, and a second of the two edge sections 305 may have memory cells coupled with even-indexed digit lines.

Respective refresh counters for the memory dies 205-e, 205-f may have been set (e.g., initialized) to different (offset, staggered) values (e.g., due to different associated fuse settings), and their respective refresh counters may continue to be offset in value as both memory dies 205-e, 205-f perform refresh operations in response to shared refresh commands over a shared CA bus.

The offset between refresh counter values for the two memory dies 205-e, 205-f may be sufficiently large that, when the refresh counter for memory die 205-e indicates a row address within an edge section 305, the refresh counter for memory die 205-f indicates a row address within an inner section 310. For example, each memory section 305, 310 of the two memory dies 205-c, 205-f may include a same number of rows of memory cells (and thus a same number of word lines). The number of rows in one memory section 305, 310 within an array may be referred to as a digit line length, as the digit lines in a given section may span (e.g., be coupled with) all the word lines in that section. For example, a digit line length of 1,024 may indicate that each memory section 305, 310 includes 1,024 word lines. It is to be understood that any numeric example herein is provided solely for the sake of illustrative clarity and is not limiting. If the two refresh counters for the two memory dies 205-e, 205-f are offset by an amount greater than or equal to the digit line length (e.g., based on being initialized to different values separated by the amount of offset), then when one refresh counter indicates a row address in an edge section 305, the other refresh counter may indicate a row address in an inner section 310, as both counters may increment together as shared refresh commands are received.

In some cases, since multiple rows may be activated when activating edge sections 305 (e.g., a first row in a first edge section 305 and a second row in a second edge section 305), the corresponding refresh counter may be indexed to one of the activated multiple rows. For example, a row decoder may be configured to activate both row 315-*a* and row 315-*b* when the value of a refresh counter has a particular value (e.g., row 315-*a* and row 315-*b* may have a common (same) row address). Additionally, in some cases, even though the absolute location of the rows which are activated in each edge section 305 may be different from each other, the relative locations of the activated rows within each edge section 305 may be the same. For instance, if a first row in a first edge section 305 is activated and is the Xth row within that first edge section 305, a second row in a second edge section 305 that is the Xth row (or row with address X) within that second edge section 305 may also be activated.

In the example of FIG. 3A, a first refresh command may be received over a shared CA bus by both memory dies 205-*e*, 205-*a*. At the time the first refresh command is received, the refresh counter for memory die 205-*e* may indicate a row address for one of rows 315-*a* or 315-*b*, and the refresh counter for memory die 205-*f* may indicate a row address for row 315-*c*. As described herein, rows 315-*a* and 315-*b* may in some cases correspond to a same relative location or to a same address within their respective edge sections 305.

Row 315-*a* in edge section 305-*a* and 315-*b* may in edge section 305-*b* may be activated based on the value of the refresh counter for memory die 205-*e* when the first refresh command is received, and row 315-*c* in an inner section 310-*c* may be activated based on the value of the refresh counter for memory die 205-*f* when the first refresh command is received. Some or all of the memory cells within rows 315-*a*, 315-*b*, and 315-*c* may be refreshed (e.g., concurrently). For example, in some cases, all of the memory cells within an activated row in an inner section 310 (e.g., row 315-*c*) may be refreshed, and a portion (e.g., half) of the memory cells within activated rows in edge sections 305 (e.g., rows 315-*a* and 315-*b*) may be refreshed.

As subsequent refresh commands are received, the two memory dies 205-*e*, 205-*f* may perform a same number of refresh operations in response to each refresh command, and thus their respective refresh counters may increment by like amounts, such that the offset between their respective refresh counters is maintained. For example, in the example of FIG. 3B, a second refresh command may be received over a shared CA bus by both memory dies 205-*e*, 205-*f* (e.g., at a time prior to or subsequent to the first refresh command). In response to the second refresh command, memory die 205-*e* may activate row 315-*d* within inner section 310*a*, while memory die 205-*f* may activate row 315-*e* within edge section 305-*c* and row 315-*f* within edge section 305-*d*.

Although FIGS. 3A and 3B may illustrate examples in which a single row is activated within a single inner section 310, there may be examples where multiple rows may each be activated (e.g. concurrently) as part of a single refresh operation, with each of the activated rows within a different inner section 310 (e.g., the activated rows may be distributed across four, eight, or sixteen inner sections 310). Such rows may collectively be referred to as a row group or, in cases where the rows each correspond to respective word lines, as a word line group.

Where multiple rows may be activated as part of a single refresh operation, the multiple rows each within a different inner section 310, the corresponding refresh counter may be indexed to one of the multiple activated rows. Additionally, in some cases, even though the absolute location of the rows which are activated may be different from each other, the relative location of the activated rows within each respective inner section 310 may be the same. For instance, if a first row in a first inner section 310 is activated and is the Yth row of that first inner section 310, a second row in a second inner section 310 that is the Yth row of that second inner section 310 may also be activated. Accordingly, when the last row of the first inner section 310 is activated, the last row of the second inner section 310 may correspondingly be activated. Similarly, when the first row of the first inner section 310 is activated, the first row of the second inner section 310 may also be activated.

In some cases, to introduce an offset between the refresh counters for different memory dies 205, an additive approach may be taken. For example, different fixed amounts may be added to the refresh values that would otherwise be maintained or indicated by the refresh counters 165 at one or more memory dies 205, with the amount (if any) added at an individual memory die 205 set by the configuration of the fuse circuitry 210 for the memory die. The fixed amount added to a refresh counter 165 may be equal to an integer multiple of an adjustment factor, where the adjustment factor may be equal to the digit line length for the memory die 205. Alternatively, the adjustment factor may be greater than the digit line length for the memory die 205. The refresh counters 165 for different memory dies 205 may be adjusted by different multiples of the adjustment factor. In some cases, an additive approach (such as those described below with reference to the example of FIG. 4A) may help ensure that refresh operations are always in different sections of different dies as, for example, the adjustment factor may be set to any desired amount, among other benefits that may be appreciated by one of ordinary skill in the art.

And in some cases, to introduce an offset between the refresh counters for different memory dies 205, an inverting approach may be taken. For example, one or more bits (e.g., some number of most significant bits (MSBs)) may be inverted within the refresh values that would otherwise be maintained or indicated by the refresh counters 165 at one or more memory dies 205, with the bits (if any) that are inverted set by the configuration of the fuse circuitry 210 for the memory die. The amount by which the value of a refresh counter 165 is adjusted may depend on which bits are inverted and their respective significance. Further, the amount by which the value of a refresh counter 165 is changed may be equal to an integer multiple of an adjustment factor, where the adjustment factor may be equal to or greater than the digit line length for the memory die 205. The values of the refresh counters for different memory dies 205 may be adjusted by different multiples of the adjustment factor. In some cases, an inverting approach (such as those described below with reference to the examples of FIGS. 4B and 4C) may provide benefits related to design complexity and areal efficiency, among other benefits that may be appreciated by one of ordinary skill in the art.

Figure 4A:
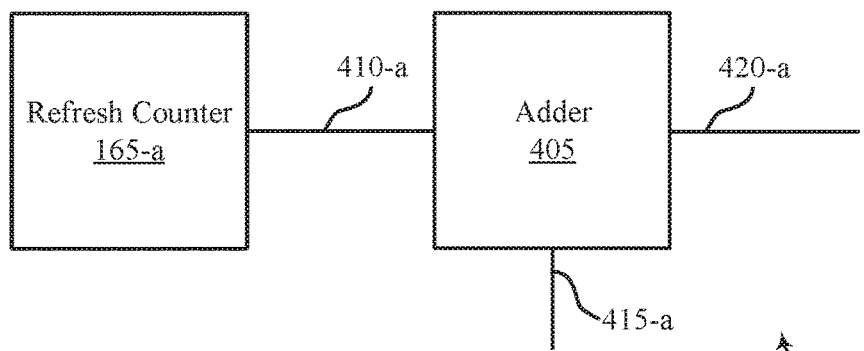
FIGS. 4A, 4B, and 4C illustrate examples of circuits that support staggered refresh counters for a memory device in accordance with examples as disclosed herein.

FIG. 4A illustrates an example of a circuit 400-*a* for adjusting a value associated with a refresh counter 165-*a* using an additive approach, which may support introducing an offset between the refresh counter 165-*a* and a refresh counter 165 associated with a different memory die 205.

The memory die 205 that includes the refresh counter 165-*a* may also include an adder 405, and the adder 405 may be configured to add a fixed amount to the value that would otherwise be indicated by the refresh counter for the memory die 205. The adder 405 may be coupled with the refresh counter 165-*a* by link 410*a*, where link 410-*a* may be configured to provide to adder 405 a value indicated (maintained, generated) by the refresh counter 165-*a*.

Thus, for example, when the refresh counter would otherwise indicate a value equal to X, the adder may output over link 420-a a value equal to X plus the fixed amount (subject to rollover effects), and thus the adders for different memory dies 205 may output different values based on being set to add different fixed amounts. Link 420-a may be coupled with, for example, a memory controller or row decoder within the memory die 205.

The fixed amount added by an adder for a memory die 205 may be determined (set, indicated) by, for example, a signal received over link 415-a that may be generated based on or otherwise indicative of a configuration of a fuse circuitry 210 for the memory die 205. For example, the settings of the fuse circuitry 210 may be read and latched for the adder 405 upon a boot event.

Though the example of FIG. 4A illustrates the adder 405 as coupled with the refresh counter 165-a, the adder 405 may alternatively be considered as included in the refresh counter 165-a; the teachings herein are irrespective of and not dependent on such conceptualizations.

Figure 4B:
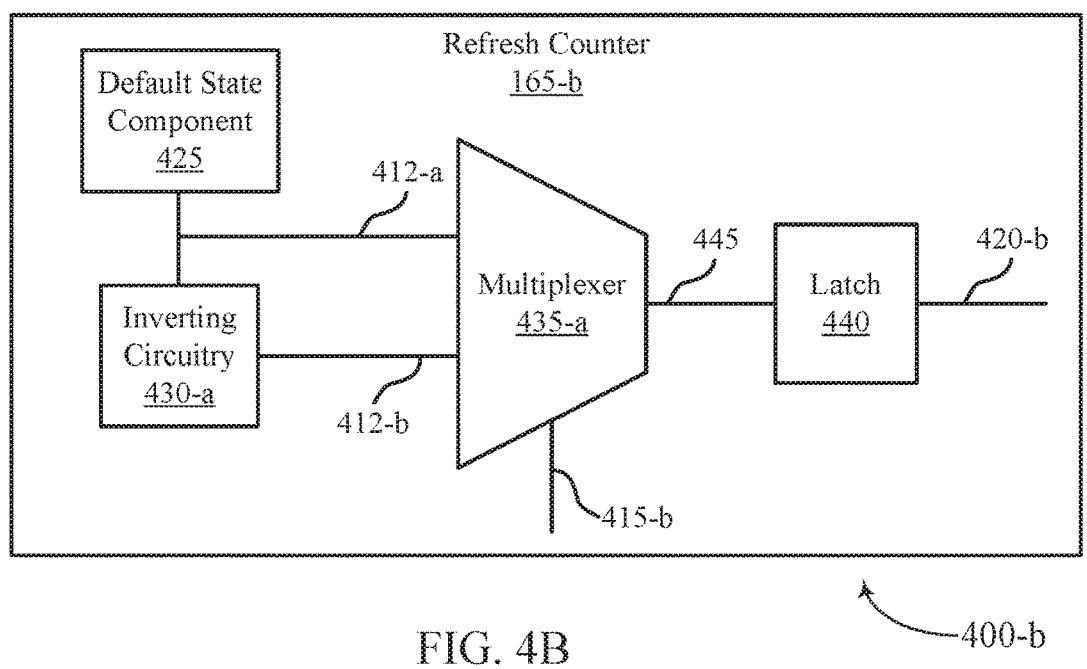

In some cases, to introduce an offset between the refresh counters for different memory dies 205, an inverting approach may be taken. FIG. 4B illustrates an example of a circuit 400-a for adjusting a value associated with a refresh counter 165-b using an inverting approach, which may support introducing an offset between the refresh counter 165-b and a refresh counter 165 associated with a different memory die 205.

The refresh counter 165-b may include a default state component 425, inverting circuitry 430a, a multiplexer 435-a, and a latch 440. It is to be understood that the refresh counter 165-b may also include any number of additional components (e.g., adders), but such additional components may not be shown for the sake of clarity in describing the illustrated components.

The latch 440 may be configured to maintain the logic value of one bit of the value (refresh index) maintained by the refresh counter 165-b and to indicate the logic value of that one bit over link 420-a. Link 420-a may be coupled with, for example, a memory controller or row decoder within the memory die 205. Default state component 425 may be configured to provide (generate, output) a signal over link 412-a that indicates a default (e.g., non-inverted) state (value) for an input to the latch 440. Inverting circuitry 430-a (e.g., an inverter) may be coupled with default state component 425 via link 412-a, and inverting circuitry 430-a may be configured to provide (generate, output) a signal over link 412-b that indicates an inverted state (value) for the input to the latch 440 that is, the inverse of the default state indicated over link 412-a.

The multiplexer 435-a may be coupled with default state component 425 via link 412-a and with inverting circuitry 430-a via link 412-b. The multiplexer 435-a may be configured to select either the default state (e.g., as indicated via link 412-a) or the inverted state (e.g., as indicated via link 412-b) and output a signal that indicates the selected state over link 445, where link 445 may be coupled with the input of the latch 440. The multiplexer may be configured to select whether the default state or the inverted state is input to the latch 440 based on, for example, a signal received over link 415-b, which may be generated based on or may otherwise be indicative of a configuration of a fuse circuitry 210 for the memory die 205. Thus, because the output of the latch 440 may be based on the signal received at the input of the latch 440 via link 445, the configuration of the fuse circuitry 210 may control whether the logic value output over the link 420-a is a default value or an inverted value.

The value of refresh counter 165-b may comprise any quantity of bits. Some or all of the components illustrated in FIG. 4B may be associated with a single bit as described, and it is to be understood that such components may be replicated to provide a desired quantity of bits, each of which may independently be selectively inverted or non-inverted based on the configuration of the fuse circuitry 210 for the memory die 205. For example, refresh counter 165-b may include a respective latch 440 and a respective multiplexer 435-a for each bit of the value of refresh counter 165-b. For example, if a subset of the bits of the value are inverted (e.g., some number of MSBs) based on a corresponding subset of the latches 440 be configured to receive inverted inputs, then the value of the refresh counter 165-b may be changed by an amount based on the significance of the inverted bits.

Though the example of FIG. 4B illustrates default state component 425, inverting circuitry 430a, and multiplexer 435-a as included in the refresh counter 165-b, these aspects may alternatively be considered as coupled with the refresh counter 165-b; the teachings herein are irrespective of and not dependent on such conceptualizations.

Figure 4C:
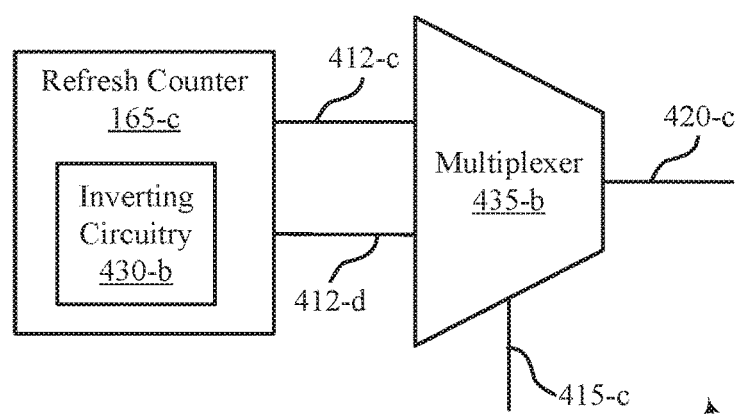

FIG. 4C illustrates another example of a circuit 400-c for adjusting a value associated with a refresh counter 165-c using an inverting approach, which may support introducing an offset between the refresh counter 165-c and a refresh counter 165 associated with a different memory die 205.

The memory die 205 that includes the refresh counter 165-c may also include a multiplexer 435-b. The refresh counter 165-c may also include inverting circuitry 430-a (e.g., one or more inverters, or latches configured to output both true (non-inverted) and complementary (inverted) values for a latched state. The multiplexer 435-b may be coupled with the refresh counter 165-c by links 412-c and 412-d, where link 412-c be configured to provide to multiplexer 435-b values of bits value indicated (maintained, generated) by the refresh counter 165-c, and link 412-d may be configured to provide to multiplexer 435-b inverted values of those bits (e.g., as generated by inverting circuitry 430-a).

For each bit of a value of the refresh counter 165-c, the multiplexer 435-b may be configured to select either a non-inverted (e.g., via link 412-c) or an inverted (e.g., via link 412-d) value of the bit based on, for example, a signal received over link 415-b that may be generated based on or otherwise indicative of a configuration of a fuse circuitry 210 for the memory die 205. If a subset of the bits of the value are inverted (e.g., some number of MSBs), then the value output by the multiplexer 435-b over link 420-c (which may be considered as the value of the refresh counter 165-c, as perceived by other components of the memory die 205) may be changed by an amount based on the significance of the inverted bits. Link 420-c may be coupled with, for example, a memory controller or row decoder with the memory die 205.

Whether one or more bits of the refresh counter value for a memory die 205 are to be inverted or not inverted may be determined (set) by, for example, one or more signals received over links 415 that may be generated based on or otherwise indicative of a configuration of a fuse circuitry 210 for the memory die 205, which may provide a signal or other indication of whether a multiplexer 435 is to select an inverted or non-inverted value for each bit (or each bit in a subset of bits that may potentially be inverted). For example, the settings of the fuse circuitry 210 may be read and latched for the multiplexer 435 upon a boot event.

Though the example of FIG. 4C illustrates the multiplexer 435-b as coupled with the refresh counter 165-c, the multiplexer 435-b may alternatively be considered as included in the refresh counter 165-c; the teachings herein are irrespective of and not dependent on such conceptualizations.

Returning to FIG. 2, in some cases, the different settings for the different fuse circuitries 210 may be set (blown) at a testing stage for the memory device 202. In some cases, depending on the quantity of memory dies 205 included in the memory device 202, the number of rows within a memory die 205 that are refreshed per refresh operation, the digit line length for each memory die 205, the number of memory sections within each memory die 205, or any combination thereof, it may or may not be possible to configure offsets between refresh counters such that no two memory dies 205 ever refresh edge sections concurrently (e.g., in response to the same refresh command). For example, a second memory die 205 may be offset from a first memory die 205 by one section in terms of refreshed memory cells, a third memory die may be offset from the first memory die 205 by two sections, and so on, but based on the above factors or otherwise (e.g., based on a sufficiently large number of memory dies 205 within the memory device 202), at least one other memory die 205 may refresh the same section as the first memory die 205 in response to a refresh command.

However, the teachings herein may nevertheless be utilized to avoid all memory dies 205 refreshing edge sections concurrently (e.g., in response to the same refresh command), and in some cases to equalize or nearly equalize the number of memory dies 205 that refresh edge sections across refresh commands. For example, in a rank with eighteen memory dies 205, three of the memory dies 205 may refresh edge sections in response to each refresh command (as opposed to, for example, all eighteen of the memory dies 205 refreshing edge sections in response to every sixth refresh command, and none of the memory dies 205 refreshing edge sections in response to other refresh commands). Thus, current/power spikes for the memory device 202 may be avoided or reduced that is, the current and power draw for the memory device may be smoothened and PAPR, for the memory device 202 may be improved.

In some cases, a memory array within a memory die 205 may include multiple banks, where each bank may include both edge sections 305 and inner sections 310. The example of FIG. 3 may illustrate the memory sections within one bank within a memory die 205, for example, though the memory die 205 may also include one or more additional banks. In some cases, memory cells in one bank of a memory die 205 may be accessed independently of (and thus potentially concurrently with) memory cells in another bank of the memory die 205. Within a single bank, however, memory cells in only one memory section may be accessed at a time.

In some cases, a memory device 202 and memory dies there may support two different types of refresh commands and two corresponding types of refresh operations. A first type of refresh command may be referred to as a per-bank refresh command, in response to which a memory die 205 may perform a per-bank refresh operation in which the memory die 205 refreshes memory cells within a single bank (e.g., a bank indicated by or otherwise determined based on the per-bank refresh command). For per-bank refresh operations, structures and techniques as described herein may reduce the number of concurrently refreshed edge sections across the memory dies 205 within a memory device 202 as described above.

A second type of refresh command may be referred to as an all-bank refresh command, in response to which a memory die 205 may perform an all-bank refresh operation in which the memory die 205 refreshes memory cells within each bank included in the memory die 205. In some cases, an all-bank refresh command may result in multiple edge sections being refreshed within a single memory die 205 (e.g., an edge section refresh may be performed in each bank of the memory die 205). However, as described above, current/power spikes for the memory device 202 may be avoided or reduced based on structures and techniques as described herein—that is, the current and power draw for the memory device may be smoothened—and PAPR for the memory device 202 may be improved from the memory device 202 perspective (e.g., at the module level), as the number of memory dies 205 that refresh edge sections may be equalized or nearly equalized across refresh commands.

Additionally or alternatively, structures and techniques as described herein may be extended to the die level to equalize or nearly equalize the number of edge sections within a memory die 205 (that is, across multiple banks of the memory die 205) that are refreshed across refresh commands. For example, memory dies 205 may each include multiple refresh counters (e.g., one for each bank of the corresponding memory die 205), and fuse circuitries 210 may include multiple settings to offset the refresh counters for different banks in like fashion as described herein for offsetting the refresh counters for different memory dies 205 within a memory device 202. In some cases, when such die level techniques are combined with module level techniques, an increased number of memory dies 205 may refresh edge sections in response to a single refresh command (e.g., relative to when such die level techniques are not employed), but peak power or current levels at the die level may be reduced and PAPR at the die level may be improved, and peak power or currently levels and PAPR for the memory device 202 may not be adversely impacted (e.g., relative to when such die level techniques are not employed).

FIG. 4 shows a block diagram 400 of a memory array 405 that supports staggered refresh counters for a memory device in accordance with examples as disclosed herein. The memory array 405 may be an example of aspects of a memory array as described with reference to FIGS. 1 through 4. The memory array 405 may include a word line index adjustment component 410, a command receiver 415, a word line activation component 420, a refresh component 425, a fuse reading component 430, a boot procedure component 435, and a word line identification component 440. Each of these modules may communicate, directly or indirectly, with one another (e.g., via one or more buses).

The word line index adjustment component 410 may adjust a respective word line index for one or more refresh counters of a set of refresh counters, where each refresh counter of the set corresponds to a respective memory die of a set of memory dies, and where the respective word line indices for at least two refresh counters of the set are offset based on the adjusting. In some examples, the word line index adjustment component 410 may increase or decrease each respective word line index of the one or more refresh counters by an integer multiple of an adjustment factor. In some examples, the word line index adjustment component 410 performing the increasing or decreasing may involve inverting one or more bits of each respective word line index of the one or more refresh counters.

In some cases, each memory die of the set includes a memory array having a set of array sections. In some cases, each array section of the set includes a quantity of word lines. In some cases, the adjustment factor is equal to or greater than the quantity of word lines.

The command receiver 415 may receive a refresh command for the set of memory dies. In some cases, the refresh command is received via a channel that is common to each memory die of the set.

The word line activation component 420 may activate, for each memory die of the set, a respective set of one or more word lines based on the refresh command and the respective word line indices. In some cases, the respective set of one or more word lines for a first memory die of the set includes a first quantity of word lines. In some cases, the respective set of one or more word lines for a second memory die of the set includes a second quantity of word lines that is greater than the first quantity. In some cases, the respective set of one or more word lines for the first memory die are within an inner section of a memory array of the first memory die. In some cases, the respective set of one or more word lines for the second memory die are within an edge section of the memory array of the first memory die.

In some examples, the word line index adjustment component 410 may increment the respective word line indices of the set of refresh counters based on the refreshing. In some examples, the command receiver 415 may receive a second refresh command for the set of memory dies, where, based on the incrementing, the respective word line indices for the at least two refresh counters of the set of refresh counters are offset by a same amount when the second refresh command is received as when the refresh command is received. In some examples, the word line activation component 420 may activate, for each memory die of the set of memory dies, a second respective set of one or more word lines based on the refresh command and the respective word line indices. In some examples, the refresh component 425 may refresh, for each memory die of the set of memory dies, a second respective set of memory cells based on the word line activation component 420 activating the second respective set of one or more word lines.

The refresh component 425 may refresh, for each memory die of the set, a respective set of memory cells based on the word line activation component 420 activating the respective sets of one or more word lines.

The fuse reading component 430 may read a respective fuse setting for each memory die of the set, where the adjusting is based on the respective fuse settings.

The boot procedure component 435 may perform a boot or reboot procedure for the set of memory dies, where the adjusting is based on the boot or reboot procedure.

In some examples, the command receiver 415 may receive a refresh command at each memory die of a set of memory dies, where the refresh command is received via a channel that is coupled with each memory die of the set. The word line identification component 440 may identify, in response to the refresh command, a respective word line address for each memory die of the set, where a first respective word line address for a first memory die of the set and a second respective word line address for a second memory die of the set are different based on a first fuse setting associated with the first memory die and a second fuse setting associated with the first memory die. In some examples, the refresh component 425 may refresh, in response to the refresh command, a first set of memory cells in the first memory die based on the first respective word line address. In some examples, the refresh component 425 may refresh, in response to the refresh command, a second set of memory cells in the second memory die based on the second respective word line address, where the second set of memory cells is associated with a greater quantity of word lines than the first set of memory cells.

In some cases, the first set of memory cells are included in an inner section of a first memory array within the first memory die. In some cases, the second set of memory cells are included in an edge section of a second memory array within the second memory die.

Figure 5:
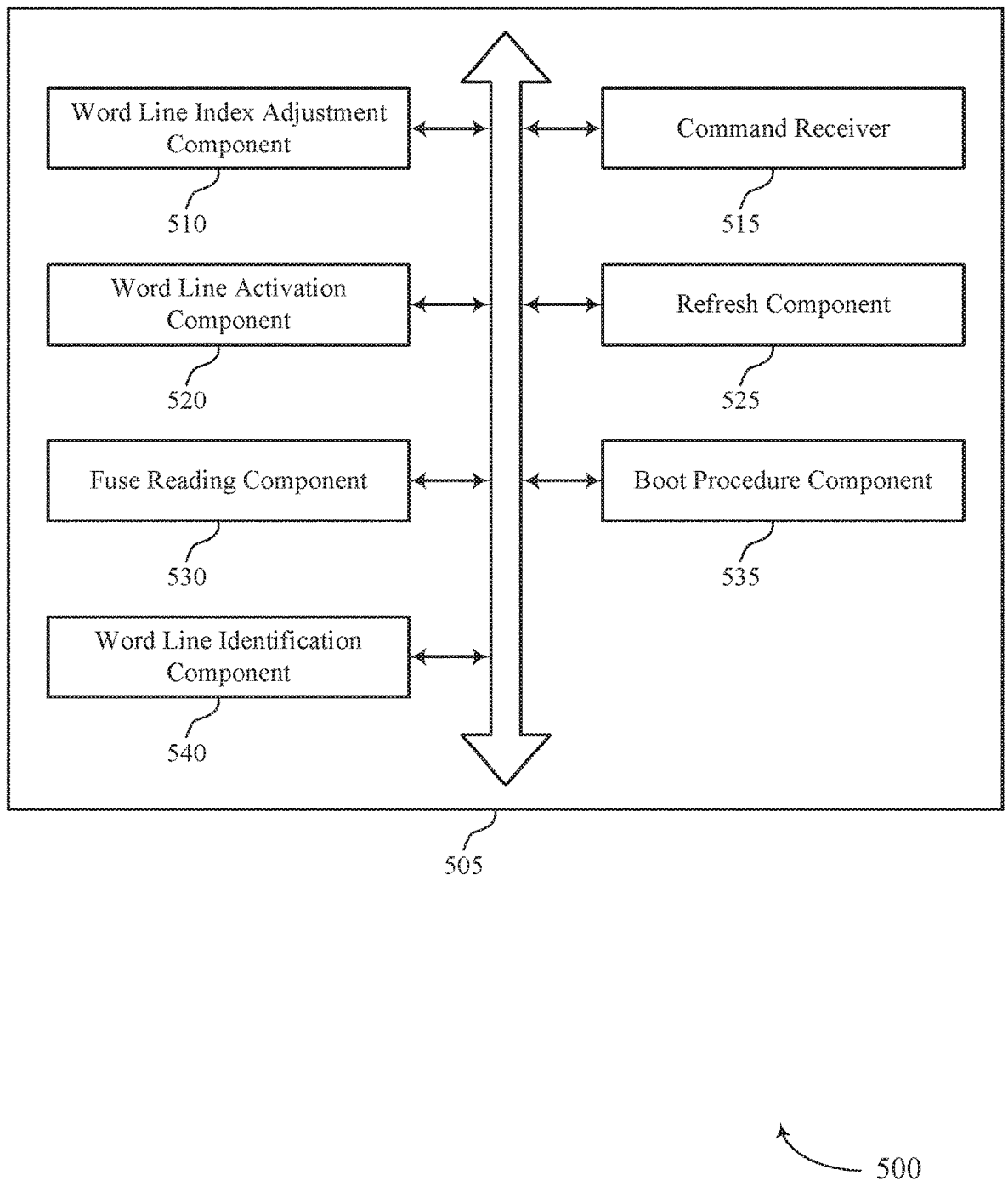
FIG. 5 shows a block diagram of a memory array that supports staggered refresh counters for a memory device in accordance with examples as disclosed herein.

FIG. 5 shows a flowchart illustrating a method or methods 500 that supports staggered refresh counters for a memory device in accordance with examples as disclosed herein. The operations of method 500 may be implemented by a memory array or its components as described herein. For example, the operations of method 500 may be performed by a memory array as described with reference to FIG. 4. In some examples, a memory array may execute a set of instructions to control the functional elements of the memory array to perform the described functions. Additionally or alternatively, a memory array may perform aspects of the described functions using special-purpose hardware.

At 505, the memory array may adjust a respective word line index for one or more refresh counters of a set of refresh counters, where each refresh counter of the set corresponds to a respective memory die of a set of memory dies, and where the respective word line indices for at least two refresh counters of the set are offset based on the adjusting. The operations of 505 may be performed according to the methods described herein. In some examples, aspects of the operations of 505 may be performed by a word line index adjustment component as described with reference to FIG. 4.

At 510, the memory array may receive a refresh command for the set of memory dies. The operations of 510 may be performed according to the methods described herein. In some examples, aspects of the operations of 510 may be performed by a command receiver as described with reference to FIG. 4.

At 515, the memory array may activate, for each memory die of the set, a respective set of one or more word lines based on the refresh command and the respective word line indices. The operations of 515 may be performed according to the methods described herein. In some examples, aspects of the operations of 515 may be performed by a word line activation component as described with reference to FIG. 4.

At 520, the memory array may refresh, for each memory die of the set, a respective set of memory cells based on activating the respective sets of one or more word lines. The operations of 520 may be performed according to the methods described herein. In some examples, aspects of the operations of 520 may be performed by a refresh component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for adjusting a respective word line index for one or more refresh counters of a set of refresh counters, where each refresh counter of the set corresponds to a respective memory die of a set of memory dies, and where the respective word line indices for at least two refresh counters of the set are offset based on the adjusting, receiving a refresh command for the set of memory dies, activating, for each memory die of the set, a respective set of one or more word lines based on the refresh command and the respective word line indices, and refreshing, for each memory die of the set, a respective set of memory cells based on activating the respective sets of one or more word lines.

Some examples of the method 500 and the apparatus described herein may further include operations, features, means, or instructions for reading a respective fuse setting for each memory die of the set, where the adjusting may be based on the respective fuse settings.

Some examples of the method 500 and the apparatus described herein may further include operations, features, means, or instructions for performing a boot or reboot procedure for the set of memory dies, where the adjusting may be based on the boot or reboot procedure.

In some examples of the method 500 and the apparatus described herein, the adjusting may include operations, features, means, or instructions for increasing or decrease each respective word line index of the one or more refresh counters by an integer multiple of an adjustment factor.

In some examples of the method 500 and the apparatus described herein, each memory die of the set includes a memory array having a set of array sections, each array section of the set includes a quantity of word lines, and the adjustment factor may be equal to or greater than the quantity of word lines.

In some examples of the method 500 and the apparatus described herein, the increasing or decreasing may include operations, features, means, or instructions for inverting one or more bits of each respective word line index of the one or more refresh counters.

In some examples of the method 500 and the apparatus described herein, the respective set of one or more word lines for a first memory die of the set includes a first quantity of word lines, and the respective set of one or more word lines for a second memory die of the set includes a second quantity of word lines that may be greater than the first quantity.

In some examples of the method 500 and the apparatus described herein, the respective set of one or more word lines for the first memory die may be within an inner section of a memory array of the first memory die, and the respective set of one or more word lines for the second memory die may be within an edge section of the memory array of the first memory die.

Some examples of the method 500 and the apparatus described herein may further include operations, features, means, or instructions for incrementing the respective word line indices of the set of refresh counters based on the refreshing, receiving a second refresh command for the set of memory dies, where, based on the incrementing, the respective word line indices for the at least two refresh counters of the set of refresh counters may be offset by a same amount when the second refresh command may be received as when the refresh command may be received, activating, for each memory die of the set of memory dies, a second respective set of one or more word lines based on the refresh command and the respective word line indices, and refreshing, for each memory die of the set of memory dies, a second respective set of memory cells based on activating the second respective set of one or more word lines.

In some examples of the method 500 and the apparatus described herein, the refresh command may be received via a channel that may be common to each memory die of the set.

Figure 6:
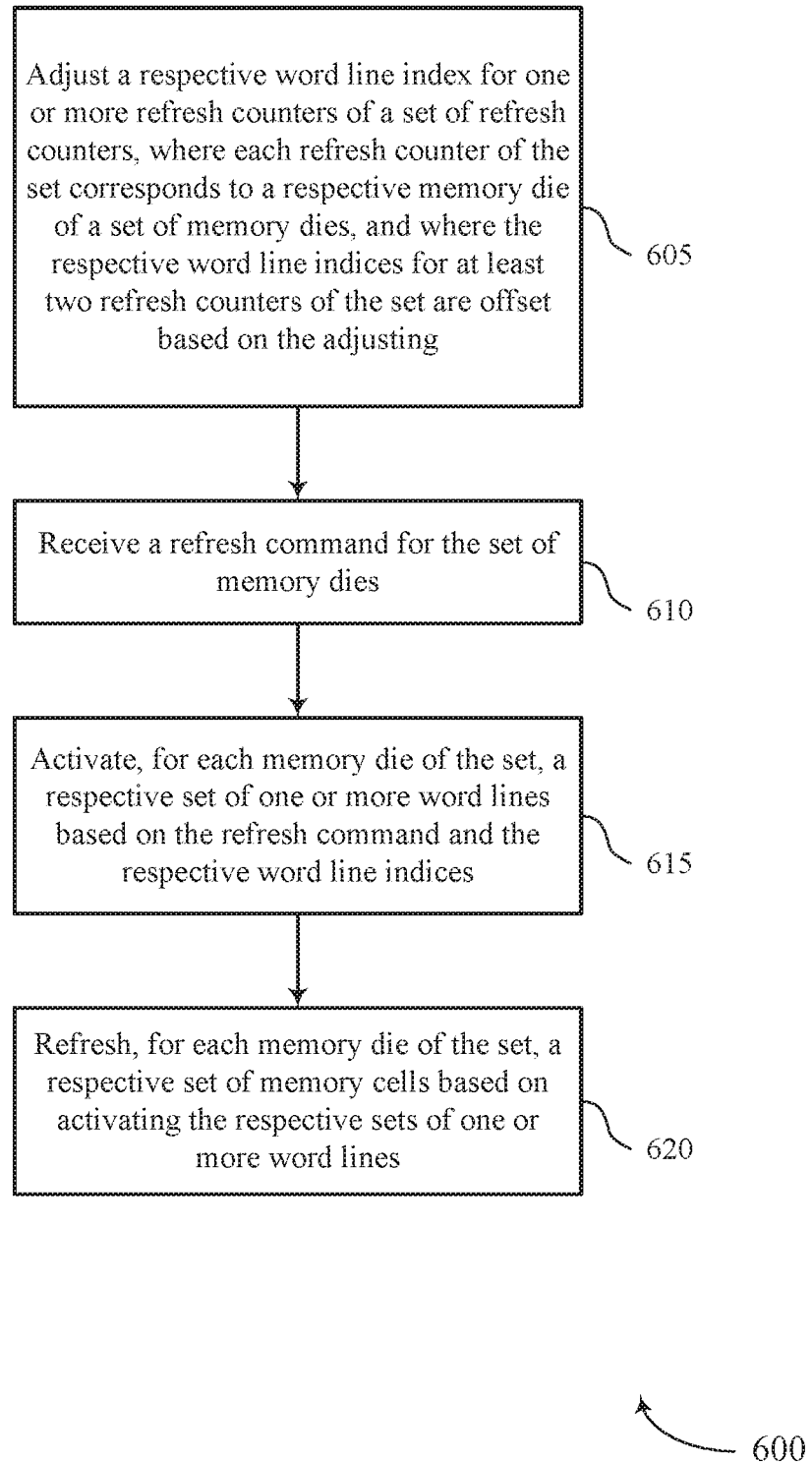
FIGS. 6 and 7 show flowcharts illustrating a method or methods that support staggered refresh counters for a memory device in accordance with examples as disclosed herein.
Figure 7:
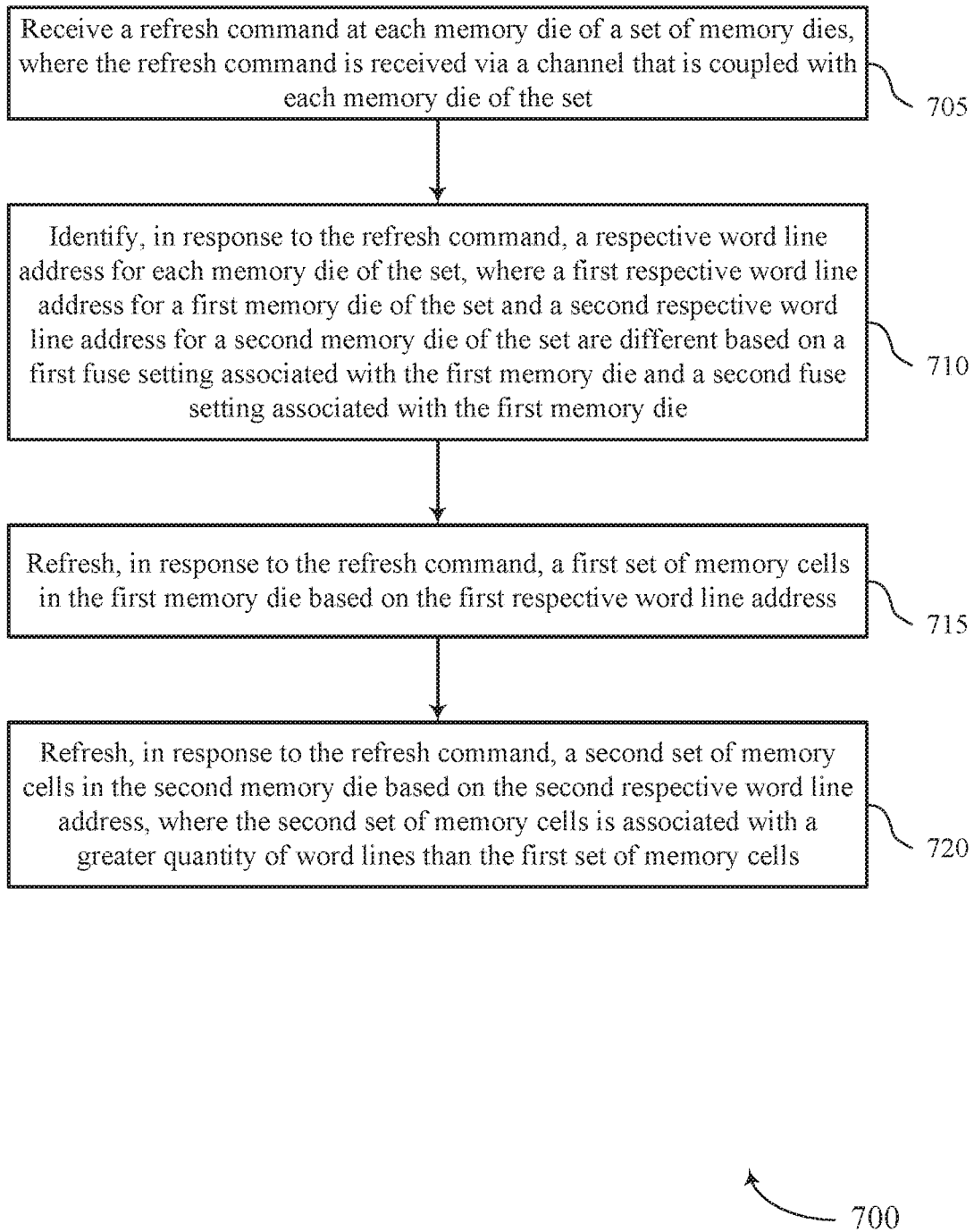

FIG. 6 shows a flowchart illustrating a method or methods 600 that supports staggered refresh counters for a memory device in accordance with examples as disclosed herein. The operations of method 600 may be implemented by a memory array or its components as described herein. For example, the operations of method 600 may be performed by a memory array as described with reference to FIG. 4. In some examples, a memory array may execute a set of instructions to control the functional elements of the memory array to perform the described functions. Additionally or alternatively, a memory array may perform aspects of the described functions using special-purpose hardware.

At 605, the memory array may receive a refresh command at each memory die of a set of memory dies, where the refresh command is received via a channel that is coupled with each memory die of the set. The operations of 605 may be performed according to the methods described herein. In some examples, aspects of the operations of 605 may be performed by a command receiver as described with reference to FIG. 4.

At 610, the memory array may identify, in response to the refresh command, a respective word line address for each memory die of the set, where a first respective word line address for a first memory die of the set and a second respective word line address for a second memory die of the set are different based on a first fuse setting associated with the first memory die and a second fuse setting associated with the first memory die. The operations of 610 may be performed according to the methods described herein. In some examples, aspects of the operations of 610 may be performed by a word line identification component as described with reference to FIG. 4.

At 615, the memory array may refresh, in response to the refresh command, a first set of memory cells in the first memory die based on the first respective word line address. The operations of 615 may be performed according to the methods described herein. In some examples, aspects of the operations of 615 may be performed by a refresh component as described with reference to FIG. 4.

At 620, the memory array may refresh, in response to the refresh command, a second set of memory cells in the second memory die based on the second respective word line address, where the second set of memory cells is associated with a greater quantity of word lines than the first set of memory cells. The operations of 620 may be performed according to the methods described herein. In some examples, aspects of the operations of 620 may be performed by a refresh component as described with reference to FIG. 4.

In some examples, an apparatus as described herein may perform a method or methods, such as the method 600. The apparatus may include features, means, or instructions (e.g., a non-transitory computer-readable medium storing instructions executable by a processor) for receiving a refresh command at each memory die of a set of memory dies, where the refresh command is received via a channel that is coupled with each memory die of the set, identifying, in response to the refresh command, a respective word line address for each memory die of the set, where a first respective word line address for a first memory die of the set and a second respective word line address for a second memory die of the set are different based on a first fuse setting associated with the first memory die and a second fuse setting associated with the first memory die, refreshing, in response to the refresh command, a first set of memory cells in the first memory die based on the first respective word line address, and refreshing, in response to the refresh command, a second set of memory cells in the second memory die based on the second respective word line address, where the second set of memory cells is associated with a greater quantity of word lines than the first set of memory cells.

In some examples of the method 600 and the apparatus described herein, the first set of memory cells may be included in an inner section of a first memory array within the first memory die, and the second set of memory cells may be included in an edge section of a second memory array within the second memory die.

It should be noted that the methods described above describe possible implementations, and that the operations and the steps may be rearranged or otherwise modified and that other implementations are possible. Further, portions from two or more of the methods may be combined.

An apparatus is described. The apparatus may include a set of memory dies, a set of refresh counters that includes a respective refresh counter for each memory die of the set, where the respective refresh counters are each configured to indicate respective refresh indices, and where the respective refresh counters for at least two memory dies of the set are configured to indicate different refresh indices, and a channel coupled with each memory die of the set, where the set of memory dies are configured to each receive a same refresh command via the channel and the at least two memory dies are configured to refresh, in response to the same refresh command, memory cells corresponding to different addresses based on the different refresh indices.

In some examples, each memory die of the set includes a memory array with sections of a first type for which refresh operations include activation of a first quantity of word lines and sections of second type for which refresh operations include activation of a second quantity of word lines that may be greater than the first quantity, a first memory die of the least two memory dies may be configured to refresh, in response to the same refresh command, memory cells included in a memory section of the first type based at least in part a first respective refresh index, and a second memory die of the least two memory dies may be configured to refresh, in response to the same refresh command, memory cells included in a memory section of the second type based at least in part a second respective refresh index.

Some examples of the apparatus may include first fuse circuitry for a first memory die of the least two memory dies, and second fuse circuitry for a second memory die of the least two memory dies, where: the first fuse circuitry and the second fuse circuitry are configured to cause an offset between a first respective refresh counter for the first memory die and a second respective refresh counter for the second memory die and the different refresh indices are based on the offset.

In some examples, each memory die of the set of memory dies includes a memory array having a set of array sections, and the offset may be greater than or equal to an integer multiple of a quantity of word lines included in an array section of the set of array sections.

In some examples, the fuse circuitry may be configured to cause the offset based on causing one or more bits of the respective refresh index for the first respective refresh counter to be inverted.

In some examples, the first memory die may include a multiplexer, where the multiplexer may be configured to select an inverted value for a bit of the one or more bits based on a configuration of the first fuse circuitry.

In some examples, the first memory die may include an adder, where the adder is configured to add an amount to the first respective refresh index based on a configuration of the fuse circuitry, and where the offset may be based on the amount.

In some examples, the respective refresh indices are or include word line addresses.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOT) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    adjusting a respective word line index for one or more refresh counters of a set of refresh counters, wherein each refresh counter of the set corresponds to a respective memory die of a set of memory dies, and wherein the respective word line indices for at least two refresh counters of the set are offset based at least in part on the adjusting;
    receiving a refresh command for the set of memory dies;
    activating, for each memory die of the set, a respective set of one or more word lines based at least in part on the refresh command and the respective word line indices; and
    refreshing, for each memory die of the set, a respective set of memory cells based at least in part on activating the respective sets of one or more word lines.

2. The method of claim 1, further comprising:
    reading a respective fuse setting for each memory die of the set, wherein the adjusting is based at least in part on the respective fuse settings.

3. The method of claim 1, further comprising:
    performing a boot or reboot procedure for the set of memory dies, wherein the adjusting is based at least in part on the boot or reboot procedure.

4. The method of claim 1, wherein the adjusting comprises:
increasing or decreasing each respective word line index of the one or more refresh counters by an integer multiple of an adjustment factor.

5. The method of claim 4, wherein:
each memory die of the set comprises a memory array having a plurality of array sections;
each array section of the plurality comprises a quantity of word lines; and
the adjustment factor is equal to or greater than the quantity of word lines.

6. The method of claim 5, wherein the increasing or decreasing comprises:
inverting one or more bits of each respective word line index of the one or more refresh counters.

7. The method of claim 1, wherein:
the respective set of one or more word lines for a first memory die of the set comprises a first quantity of word lines; and
the respective set of one or more word lines for a second memory die of the set comprises a second quantity of word lines that is greater than the first quantity.

8. The method of claim 7, wherein:
the respective set of one or more word lines for the first memory die are within an inner section of a memory array of the first memory die; and
the respective set of one or more word lines for the second memory die are within an edge section of the memory array of the first memory die.

9. The method of claim 1, further comprising:
incrementing the respective word line indices of the set of refresh counters based at least in part on the refreshing;
receiving a second refresh command for the set of memory dies, wherein, based at least in part on the incrementing, the respective word line indices for the at least two refresh counters of the set of refresh counters are offset by a same amount when the second refresh command is received as when the refresh command is received;
activating, for each memory die of the set of memory dies, a second respective set of one or more word lines based at least in part on the refresh command and the respective word line indices; and
refreshing, for each memory die of the set of memory dies, a second respective set of memory cells based at least in part on activating the second respective set of one or more word lines.

10. The method of claim 1, wherein the refresh command is received via a channel that is common to each memory die of the set.

11. An apparatus, comprising:
a set of memory dies, wherein each memory die of the set comprises a respective memory array;
a set of refresh counters that includes a respective refresh counter for each memory die of the set, wherein the respective refresh counters are each configured to indicate respective refresh indices, and wherein the respective refresh counters for at least two memory dies of the set are configured to indicate different refresh indices;
a channel coupled with each memory die of the set, wherein:
the set of memory dies are configured to each receive a same refresh command via the channel; and
the at least two memory dies are configured to refresh, in response to the same refresh command, memory cells corresponding to different addresses based at least in part on the different refresh indices.

12. The apparatus of claim 11, wherein:
the respective memory array of each memory die of the set of memory dies comprises sections of a first type for which refresh operations comprise activation of a first quantity of word lines and sections of second type for which refresh operations comprise activation of a second quantity of word lines that is greater than the first quantity;
a first memory die of the least two memory dies is configured to refresh, in response to the same refresh command, memory cells included in a memory section of the first type based at least in part a first respective refresh index; and
a second memory die of the least two memory dies is configured to refresh, in response to the same refresh command, memory cells included in a memory section of the second type based at least in part a second respective refresh index.

13. The apparatus of claim 11, further comprising:
first fuse circuitry for a first memory die of the least two memory dies; and
second fuse circuitry for a second memory die of the least two memory dies, wherein:
the first fuse circuitry and the second fuse circuitry are configured to cause an offset between a first respective refresh counter for the first memory die and a second respective refresh counter for the second memory die; and
the different refresh indices are based at least in part on the offset.

14. The apparatus of claim 13, wherein:
the respective memory array of each memory die of the set of memory dies comprises a plurality of array sections; and
the offset is greater than or equal to an integer multiple of a quantity of word lines included in an array section of the plurality of array sections.

15. The apparatus of claim 13, wherein the first fuse circuitry is configured to cause the offset based at least in part on causing one or more bits of the respective refresh index for the first respective refresh counter to be inverted.

16. The apparatus of claim 15, wherein the first memory die comprises a multiplexer, and wherein the multiplexer is configured to select an inverted value for a bit of the one or more bits based at least in part on a configuration of the first fuse circuitry.

17. The apparatus of claim 15, wherein the first memory die comprises an adder, and wherein the adder is configured to add an amount to the first respective refresh index based at least in part on a configuration of the first fuse circuitry, and wherein the offset is based at least in part on the amount.

18. The apparatus of claim 11, wherein the respective refresh indices comprise word line addresses.

19. A method, comprising:
receiving a refresh command at each memory die of a set of memory dies, wherein the refresh command is received via a channel that is coupled with each memory die of the set;
identifying, in response to the refresh command, a respective word line address for each memory die of the set, wherein a first respective word line address for a first memory die of the set and a second respective word line address for a second memory die of the set are different based at least in part on a first fuse setting associated with the first memory die and a second fuse setting associated with the first memory die;

refreshing, in response to the refresh command, a first set of memory cells in the first memory die based at least in part on the first respective word line address; and refreshing, in response to the refresh command, a second set of memory cells in the second memory die based at least in part on the second respective word line address, wherein the second set of memory cells is associated with a greater quantity of word lines than the first set of memory cells.

20. The method of claim 19, wherein:

the first set of memory cells are included in an inner section of a first memory array within the first memory die; and the second set of memory cells are included in an edge section of a second memory array within the second memory die.

* * * * *